United States Patent
DeFranco et al.

(10) Patent No.: US 9,335,636 B2
(45) Date of Patent: *May 10, 2016

(54) METHOD OF PATTERNING A DEVICE

(71) Applicant: ORTHOGONAL, INC., Rochester, NY (US)

(72) Inventors: John Andrew DeFranco, Rochester, NY (US); Francis Houlihan, Millington, NJ (US); Charles Warren Wright, Fairport, NY (US); Diane Carol Freeman, Pittsford, NY (US); Frank Xavier Byrne, Webster, NY (US); Douglas Robert Robello, Webster, NY (US); Sandra Rubsam, Webster, NY (US); Terrence Robert O'Toole, Webster, NY (US)

(73) Assignee: ORTHOGONAL, INC., Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/808,194

(22) Filed: Jul. 24, 2015

(65) Prior Publication Data

US 2015/0331325 A1    Nov. 19, 2015

Related U.S. Application Data

(63) Continuation of application No. 14/274,816, filed on May 12, 2014, which is a continuation-in-part of application No. PCT/US2012/065007, filed on Nov. 14, 2012.

(60) Provisional application No. 61/559,168, filed on Nov. 14, 2011.

(51) Int. Cl.
*G03F 7/42* (2006.01)
*G03F 7/20* (2006.01)
(Continued)

(52) U.S. Cl.
CPC ............. *G03F 7/42* (2013.01); *G03F 7/0046* (2013.01); *G03F 7/0048* (2013.01);
(Continued)

(58) Field of Classification Search
CPC .. C08L 83/00; C11D 11/0047; C11D 7/5018; C11D 7/24; C11D 7/263; C11D 7/28; G03F 7/426; G03F 7/40; G03F 7/42; G03F 7/0046; G03F 7/00; G03F 7/0048; G03F 7/038; G03F 7/325; G03F 7/0392; H01L 21/0337; H01L 21/31133; H01L 51/0018; H01L 21/027; H01L 51/0002; H01L 51/0023; H01L 51/50
USPC .............. 430/322, 270.1, 331, 324, 323, 325
See application file for complete search history.

(56) References Cited

U.S. PATENT DOCUMENTS 5,250,395 A    10/1993  Allen et al.
5,904,154 A    5/1999   Chien et al.
(Continued)

FOREIGN PATENT DOCUMENTS

WO    WO 2012/148884 A2    11/2012

OTHER PUBLICATIONS

International Search Report for corresponding International Patent Application No. PCT/US2012/065007 mailed Mar. 20, 2013.
(Continued)

*Primary Examiner* — Caleen Sullivan
(74) *Attorney, Agent, or Firm* — Merchant & Gould P.C.

(57) ABSTRACT

A photopolymer layer is formed on an organic device substrate and exposed to patterned radiation. The photopolymer layer includes a photopolymer comprising at least a first repeating unit having an acid-catalyzed, solubility-altering reactive group, wherein the total fluorine content of the photopolymer is less than 30% by weight. The pattern exposed photopolymer is contacted with a developing agent, such as a developing solution, to remove unexposed photopolymer, thereby forming a developed structure having a first pattern of exposed photopolymer covering the substrate and a complementary second pattern of uncovered substrate corresponding to the unexposed photopolymer. The developing agent comprises at least 50% by volume of a hydrofluoroether developing solvent.

18 Claims, 7 Drawing Sheets

(51) Int. Cl.
*G03F 7/16* (2006.01)
*G03F 7/32* (2006.01)
*G03F 7/004* (2006.01)
*G03F 7/039* (2006.01)

(52) U.S. Cl.
CPC ............ *G03F 7/0392* (2013.01); *G03F 7/16* (2013.01); *G03F 7/20* (2013.01); *G03F 7/325* (2013.01); *G03F 7/426* (2013.01); *G03F 7/427* (2013.01)

(56) References Cited

U.S. PATENT DOCUMENTS

| | | | |
|---|---|---|---|
| 6,646,068 | B2 | 11/2003 | O'Brien et al. |
| 7,632,630 | B2 | 12/2009 | Mori et al. |
| 2003/0215735 | A1 | 11/2003 | Wheland et al. |
| 2005/0170277 | A1 | 8/2005 | Zannoni et al. |
| 2009/0029274 | A1 | 1/2009 | Olson et al. |
| 2010/0289019 | A1 | 11/2010 | Katz et al. |
| 2011/0159252 | A1 | 6/2011 | Ober et al. |
| 2012/0135206 | A1 | 5/2012 | Haraguchi et al. |
| 2013/0108960 | A1 | 5/2013 | Hatakeyama et al. |
| 2013/0295354 | A1 | 11/2013 | Guntermann et al. |
| 2014/0248565 | A1* | 9/2014 | Defranco et al. ............. 430/325 |

OTHER PUBLICATIONS

Hwang, H. et al. "Synthesis of Copolymers Composed of 1H, 1H, 2H, 2H-perfluorodecylmethacrylate and tert-butylmethacrylate and Their Lithographic Properties in Carbon Dioxide", J. Korean Ind. Eng. Chem., vol. 19, No. 4, Aug. 2008, pp. 402-408. Abstract only.

Hong, K. et al. "Synthesis and Characterization of Poly[1-p-styrenesulfonyloxy-4-tosyloxycyclohexane)-co-(tert-butyl methacrylate)] as Positive Acid-Amplifying Photoresists", J. Korean Ind. Eng. Chem., vol. 14, No. 8, Dec. 2003, pp. 1116-1120. Abstract only.

"Orgacon™ Conductive Transparent Films Application Sheet-Patterning Orgacon™ film by means of UV lithography" revised May 2001.

Lee, J.K. et al. "Orthogonal Processing: A New Strategy for Patterning Organic Electronics", ERC Teleconference, Sep. 3, 2009.

* cited by examiner

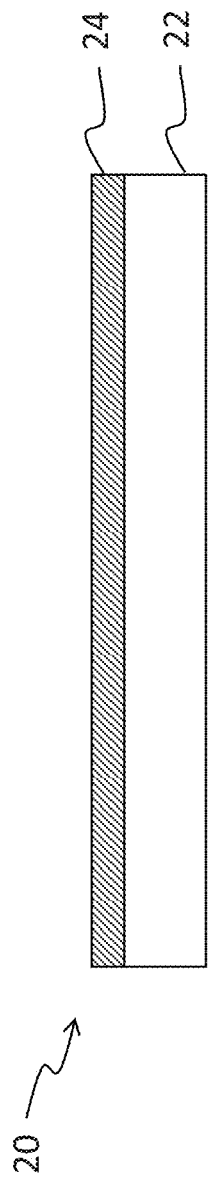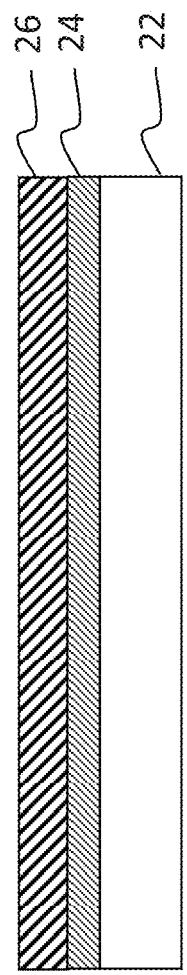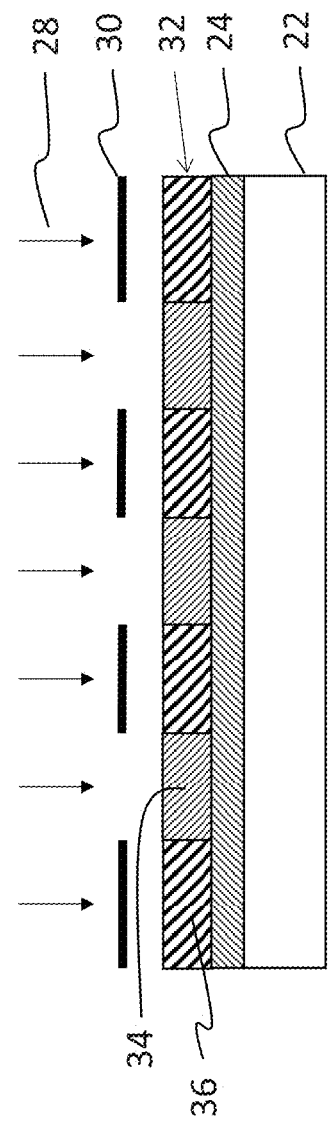

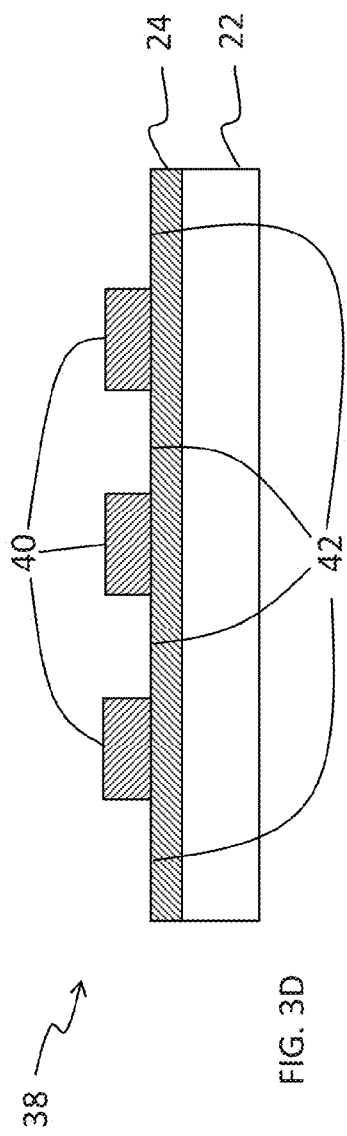
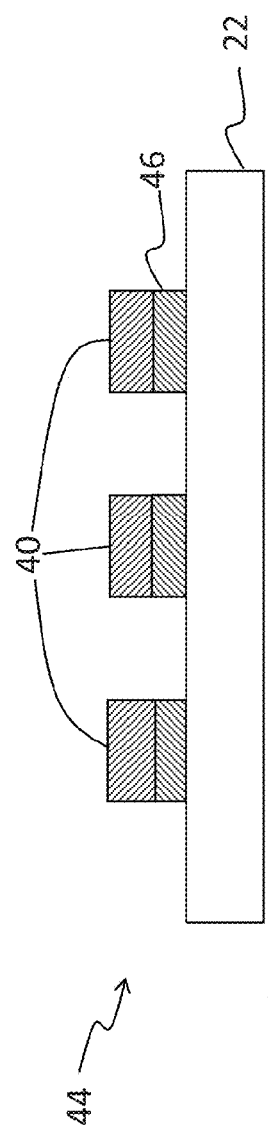
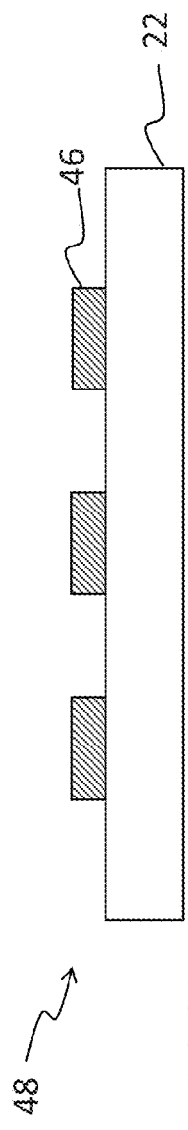

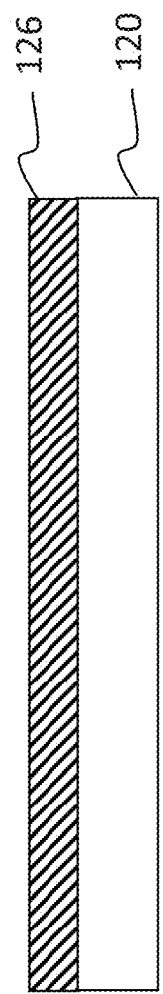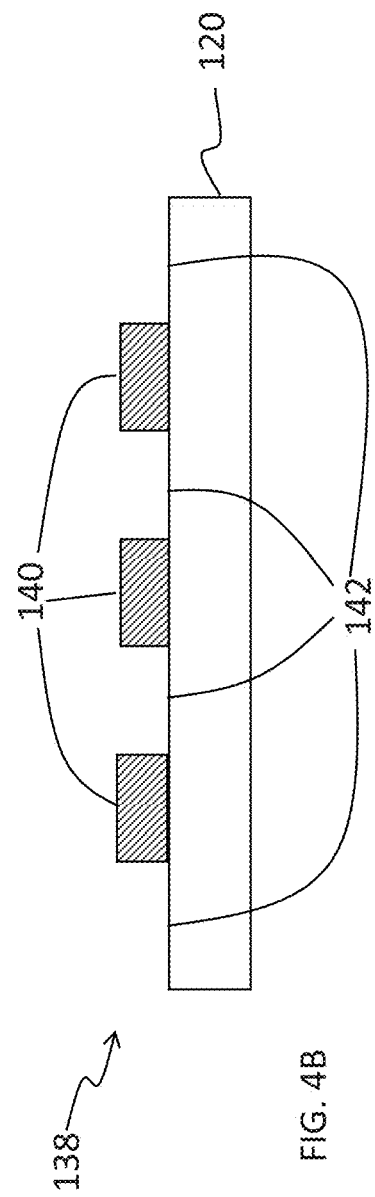

METHOD OF PATTERNING A DEVICE

CROSS-REFERENCE TO RELATED APPLICATIONS

This application is a continuation of application Ser. No. 14/274,816, filed May 12, 2014, which application is a continuation-in-part of PCT/US2012/065007, filed Nov. 14, 2012, which claims benefit of U.S. Ser. No. 61/559,168, filed Nov. 14, 2011 and which applications are incorporated herein by reference. To the extent appropriate, a claim of priority is made to each of the above disclosed applications.

BACKGROUND

1. Field of the Invention

The present invention relates to acid-catalyzed switchable photopolymers that are processed at least in part using a fluorinated solvent, wherein the photopolymers have reduced or substantially no fluorine content. Such solvents and photopolymers are particularly useful for patterning organic electronic and biological materials.

2. Discussion of Related Art

Organic electronic devices can offer significant performance and price advantages relative to conventional inorganic-based devices. As such, there has been much commercial interest in the use of organic materials in electronic device fabrication. For example, organic materials such as conductive polymers and organic semiconductors can be used to manufacture devices that have reduced weight and drastically greater mechanical flexibility compared to conventional electronic devices based on metals and silicon. Further, devices based on organic materials are likely to be significantly less damaging to the environment than devices made with inorganic materials, since organic materials do not require toxic metals and can ideally be fabricated using relatively benign solvents and methods of manufacture. Thus, in light of these superior weight and mechanical properties, and particularly in light of the lowered environmental impact in fabrication and additionally in disposal, electronic devices based on organic materials have the potential to be less expensive than devices based on conventional inorganic materials.

Fabrication of electronic devices, whether from organic or inorganic materials, requires the creation on an industrial scale of precisely defined patterns of the organic or inorganic active materials in these devices, often at a microscopic level. Most commonly, this is accomplished by "photolithography," in which a light-sensitive "photoresist" film that has been deposited on a substrate is exposed to patterned light. Although this can be done in numerous ways, typically a microscopic pattern of light and shadow created by shining a light through a photographic mask is used to expose the photoresist film, thereby changing the chemical properties of the portions of the photoresist that have been exposed to light. In a "positive" photoresist, the portions of the photoresist that are exposed to light become soluble in the "developer" solution that is then applied to the exposed photoresist, and the light-exposed portions of the photoresist are washed away ("developed") by the developer solvent to leave a pattern of unexposed photoresist and newly exposed underlying substrate. A "negative" photoresist is treated as for a positive photoresist; however, in a negative photoresist, it is the unexposed rather than the exposed portions of the photoresist that are washed away by the developing step.

In a standard process, the photoresist material is laying on top of an active material layer that is to be patterned. Once the development has taken place, the underlying layer is etched using either a liquid etchant or a reactive ion plasma (RIE) with the appropriate etch chemistry. In either case, the photoresist layer blocks the etching of active material directly beneath it. Once the etching is complete, the resist is typically stripped away, leaving the pattern of active material on the substrate.

Alternatively, the photoresist can be used with a so-called "liftoff" technique. In this case, the resist is processed on a substrate before the active material layer is deposited. After the photoresist pattern is formed, the active material is deposited on both the substrate and the photoresist. In an additional "lift-off" or "stripping" step, remaining photoresist along with an overlying layer of active material is removed via the appropriate solvent to leave the desired patterned active material.

Although the use of photoresists is routine in traditional electronic devices based on inorganic materials, photolithography has been difficult to achieve for devices using organic materials, thereby hindering the development of devices based on these materials. Specifically, organic materials are much less resistant to the solvents that are used for conventional photolithography, as well as to the intense light sources that are sometimes used in these processes, with the result that conventional lithographic solvents and processes tend to degrade organic electronics. Although there have been various attempts to overcome these problems, e.g., by ink-jet printing or shadow mask deposition, these alternative methods do not produce the same results as would be obtained with successful photolithography. Specifically, neither ink-jet printing nor shadow mask deposition can achieve the fine pattern resolutions that can be obtained by conventional lithography, with ink-jet printing limited to resolutions of approximately 10-20 µm and shadow mask deposition to resolutions of about 25-30 µm.

US 2011/0159252 discloses a useful method for patterning organic electronic materials by an "orthogonal" process that uses fluorinated solvents and photoresists having substantial amounts of fluorination. The fluorinated solvents have very low interaction with organic electronic materials. WO 2012/148884 discloses additional fluorinated material sets for orthogonal processing.

Although these disclosures demonstrate good progress, the disclosed systems have yet to be commercially adopted. Further improvements in orthogonal, photopolymer systems are needed with respect to performance and cost.

SUMMARY

In accordance with the present disclosure a method of patterning an organic electronic device using a photopolymer comprises: forming a photopolymer layer on an organic electronic device substrate by coating a composition comprising a photopolymer and a hydrofluoroether coating solvent, the photopolymer comprising at least a first repeating unit having an acid-catalyzed, solubility-altering reactive group, wherein the total fluorine content of the photopolymer is less than 30% by weight; exposing the photopolymer layer to patterned radiation to form an exposed photopolymer layer; and contacting the exposed photopolymer layer with a developing solution to remove unexposed photopolymer, thereby forming a developed structure having a first pattern of exposed photopolymer covering the substrate and a complementary second pattern of uncovered substrate corresponding to the unexposed photopolymer, the developing solution comprising at least 50% by volume of a hydrofluoroether developing solvent.

In an embodiment, the reduced fluorine content of the photopolymer results in lower manufacturing cost due to reduced use of fluorinated functional groups, which are often expensive. In an embodiment, developing and stripping solutions comprise environmentally safe solvents, despite the low fluorine content of the photopolymer, and the orthogonal behavior with respect to sensitive active organic materials is maintained. In an embodiment, good contrast can be achieved (e.g., contrast of at least 1.5) using environmentally safe solvents within a reasonable development time, despite the low fluorine content of the photopolymer.

BRIEF DESCRIPTION OF DRAWINGS

FIG. 3A-3F is a series of cross-sectional views depicting various stages in the formation of a patterned active organic material structure according to an embodiment of the present invention;

FIG. 4A-4D is a series of cross-sectional views depicting various stages in the formation of a patterned active organic material structure according to another embodiment of the present invention.

DETAILED DESCRIPTION

Figure 1:
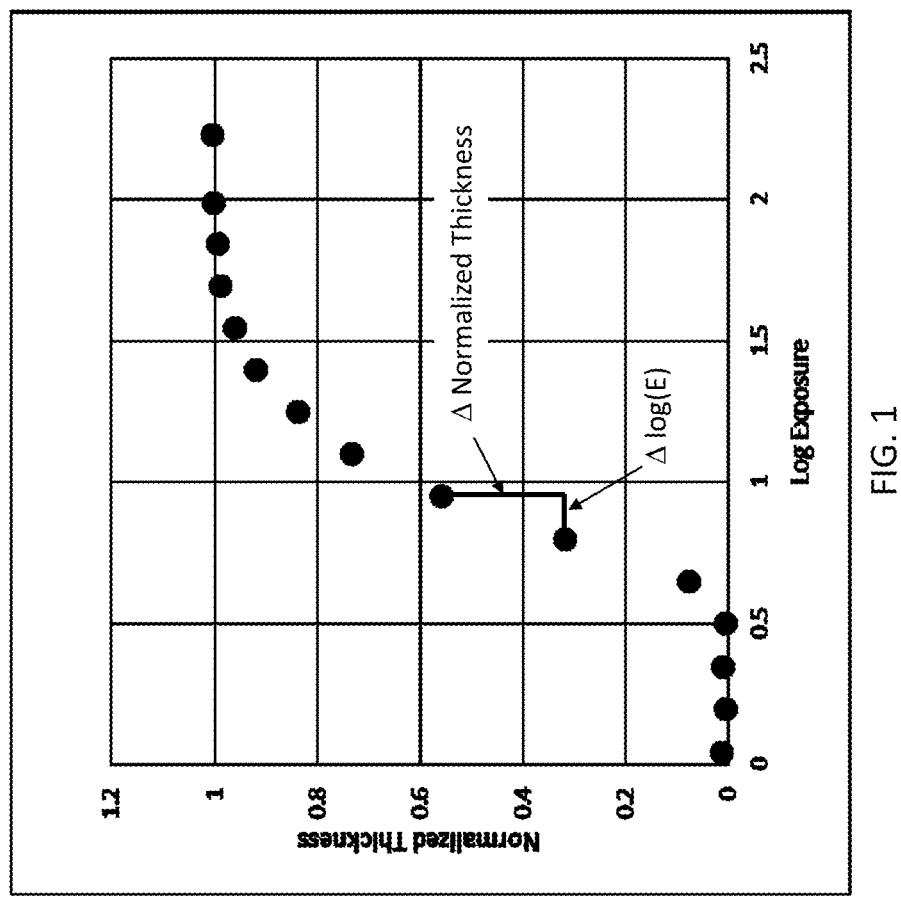
FIG. 1 is a representative plot of normalized thickness vs. log (exposure) used to determine photopolymer contrast.

It is to be understood that the attached drawings are for purposes of illustrating the concepts of the invention and may not be to scale.

An embodiment of the present invention is directed to patterning organic devices, e.g., multilayer organic electronic devices, organic optical devices, medical devices, biological devices and the like. In an embodiment, the photopolymer is used as a photoresist and removed (stripped) after use. Alternatively, the photopolymer may remain in a device structure to provide another function, e.g., as a barrier layer or a dielectric material.

Certain embodiments disclosed in the present disclosure are particularly suited to the patterning of solvent-sensitive, active organic materials. Examples of active organic materials include, but are not limited to, organic electronic materials, such as organic semiconductors, organic conductors (e.g. PEDOT:PSS), OLED (organic light-emitting diode) materials and organic photovoltaic materials, organic optical materials, medical materials and biological materials. Many of these materials are easily damaged when contacted with organic or aqueous solutions used in conventional photolithographic processes. Active organic materials are often coated to form a layer that may be patterned. For some active organic materials, such coating can be done from a solution using conventional methods. Alternatively, some active organic materials are preferentially coated by vapor deposition, for example, by sublimation from a heated organic material source at reduced pressure. Solvent-sensitive, active organic materials can also include composites of organics and inorganics. For example, the composite may include inorganic semiconductor nanoparticles (quantum dots). Such nanoparticles may have organic ligands or be dispersed in an organic matrix.

An embodiment of the present invention is based in part on the observation that, surprisingly, certain photopolymers having relatively low fluorination (less than 30% by weight) can still be coated and developed using hydrofluoroether solvents. Hydrofluoroether solvents represent a class of "orthogonal" solvents that have relatively low interaction with sensitive organic materials. An orthogonal solvent is one having low interaction with other device material layers that are not intended to be dissolved or otherwise damaged during processing with the solvent. This can be tested by, for example, immersion of a device comprising the material layer of interest into the solvent prior to operation. The solvent is orthogonal if there is no serious reduction in the functioning of the device. Hydrofluoroethers (HFEs) are highly environmentally friendly, "green" solvents. HFEs, including segregated HFEs, are preferred solvents because they are non-flammable, have zero ozone-depletion potential, lower global warming potential than some other halogenated solvents and typically show very low toxicity to humans.

Examples of readily available HFEs and isomeric mixtures of HFEs include, but are not limited to, an isomeric mixture of methyl nonafluorobutyl ether and methyl nonafluoroisobutyl ether (HFE-7100), an isomeric mixture of ethyl nonafluorobutyl ether and ethyl nonafluoroisobutyl ether (HFE-7200 aka Novec™ 7200), 3-ethoxy-I, 1,1,2,3,4,4,5,5,6,6,6-dodecafluoro-2-trifluoromethyl-hexane (HFE-7500 aka Novec™ 7500), 1,1,1,2,3,3-hexafluoro-4-(1,1,2,3,3,3,-hexafluoropropoxy)-pentane (HFE 7600 aka Novec™ 7600), 1-methoxyheptafluoropropane (HFE-7000), 1,1,1,2,2,3,4,5,5,5-decafluoro-3-methoxy-4-trifluoromethylpentane (HFE-7300 aka Novec™ 7300), 1,3-(1,1,2,2-tetrafluoroethoxyl)benzene (HFE-978m), 1,2-(1,1,2,2-tetrafluoroethoxyl)ethane (HFE-578E), 1,1,2,2-tetrafluoroethyl-1H,1H,5H-octafluoropentyl ether (HFE-6512), 1,1,2,2-tetrafluoroethyl-2,2,2-trifluoroethyl ether (HFE-347E), 1,1,2,2-tetrafluoroethyl-2,2,3,3-tetrafluoropropyl ether (HFE-458E), and 1,1,1,2,2,3,3,4,4,5,5,6,6-tridecafluorooctane-propyl ether (TE6O-C3). In an embodiment, preferred HFE solvents for developing photopolymers having less than 30% by weight fluorine include HFE-7100, HFE-7200, HFE-7600 and HFE-6512 and close isomers.

The developing solution comprises at least 50% by volume of a hydrofluoroether or a mixture of hydrofluoroethers. In an embodiment, the developing solution comprises at least 90% by volume of a hydrofluoroether or a mixture of hydrofluoroethers. In an embodiment, the developing solution comprises at least 95% by volume of a hydrofluoroether or a mixture of hydrofluoroethers. In an embodiment, the substantially all (>99% by volume) of the developing solution is comprised of a hydrofluoroether or a mixture of hydrofluoroethers.

In some embodiments, minor amounts of a non-fluorinated solvent may be added to the developing solution. Such non-fluorinated solvents include chlorinated solvents, polar solvents, alcohols and other protic organic solvents, and substituted or unsubstituted hydrocarbons and aromatic hydrocarbons, so long as they are miscible with the fluorinated solvent in the amounts desired for the developing solution and maintain orthogonal behavior with respect to active organic materials.

The optional stripping solution typically comprises a hydrofluoroether, a polar organic solvent or both. In an embodiment, the polar organic solvent is a protic organic solvent, also referred to herein simply as a protic solvent. When the fluorine content of the photopolymer is less than about 15%, particularly less than about 10% by weight, it is preferred that the stripping solution comprise a protic solvent, e.g., as the sole solvent or as a co-solvent with one or more hydrofluoroethers. In an embodiment, the stripping solution may comprise a hydrofluoroether solvent (or a mixture of hydrofluoroether solvents) but no protic solvent, preferably when the fluorine content of the photopolymer is more than about 10%, particularly more than about 15%, by weight, and preferably when the polymer includes a branching unit. Preferred protic solvents include hydroxyl-containing non-aromatic organic compounds such as alcohols, e.g., methanol, ethanol, isopropyl alcohol, butanol, pentane, and hexanol and their derivatives and isomers. In an embodiment, the stripping solution comprises a protic solvent with no hydrofluoroether. Protic solvents typically have a significant cost advantage over hydrofluoroethers, and thus the overall manufacturing cost can be substantially reduced by replacing the hydrofluoroether stripping solvent with the protic solvent. This may be used so long as any the protic solvent retains its orthogonal behavior with respect to any active organic materials that may be present. However, it has been found that even small amounts of protic solvents in a hydrofluoroether solvents make effective stripping solutions, but have a much reduced impact on sensitive organic materials. In an embodiment, the stripping solution is a mixture of a hydrofluoroether stripping solvent and a protic solvent, e.g., an alcohol. When using such mixtures, the protic solvent may be provided in a range of 0.1% to 50% by volume, or alternatively, 0.5% to 20% by volume, or alternatively 1% to 5% by volume. The lower amount of protic solvent increases the range of compatibility with various sensitive organic materials. The higher amount of protic solvent may result in more significant manufacturing costs. In an embodiment, the stripping solution comprises a mixture of a protic solvent with a hydrofluoroether solvent, and the hydrofluoroether solvent is the same as the hydrofluoroether used in the developing solution. This can greatly simplify recycling of developing and stripping solutions, thereby resulting in further manufacturing cost savings.

The photopolymer of the present disclosure is one that has at least a first repeating unit having an acid-catalyzed, solubility-altering reactive group. The total fluorine content of the photopolymer is less than 30% by weight. In an embodiment, the photopolymer has substantially no fluorination (less than 1% fluorine by weight). In an embodiment, the total fluorine content of the photopolymer is in a range of 0 to 15% by weight, or alternatively, in a range of 1 to 15%. In an embodiment, the total fluorine content of the photopolymer is in a range of 0 to 10% by weight, or alternatively, in a range of 1 to 10%. In an embodiment, a photopolymer having a small amount of fluorine (e.g., at least 1% by weight) can significantly improve stripping rate relative to a polymer having no fluorine. In an embodiment wherein the fluorine content is above 0%, the first repeating unit may include one or more fluorine atoms.

In an embodiment, the photopolymer further includes (in addition to the solubility-altering reactive group) a repeating unit having a fluorine-containing group. In an embodiment, the photopolymer further includes (in addition to the solubility-altering reactive group) a repeating unit having a sensitizing dye. In an embodiment the photopolymer further includes (in addition to the solubility-altering reactive group) one or more branching units. In a preferred embodiment, the acid-catalyzed, solubility-altering reactive group is an acid-forming precursor group or an alcohol-forming precursor group. The terms "photopolymer", "polymer" and "copolymer" include oligomers in addition to higher MW polymers. In an embodiment, the MW of the photopolymer is at least 2500 daltons, or in another embodiment at least 5000 daltons, or in another embodiment, at least 10,000 daltons. A copolymer is suitably a random copolymer, but other copolymer types can be used, e.g., block copolymers, alternating copolymers, graft copolymers and periodic copolymers. The term "repeating unit" is used broadly herein and simply means that there is at least one unit, typically more than one unit, on a polymer chain. The term is not intended to convey that there is necessarily any particular order or structure with respect to the other repeating units unless specified otherwise. When a repeating unit represents a low mole % of the combined repeating units, there may be only one unit on a polymer chain.

A coatable photopolymer solution may include the photopolymer material, a photo-acid generator compound (PAG) and a coating solvent that comprises at least 50% of a fluorinated solvent, preferably a hydrofluoroether, and may optionally further include one or more additional components such as a stabilizer, a light sensitizer, a light filter, an acid scavenger (quencher) or a coating aid. Common quenchers include, but are not limited to, basic nitrogen-containing compounds such as tertiary amines. A layer comprising the photopolymer material should be sensitive to radiation, e.g., UV or visible light, e-beam, X-ray and the like, so that the solubility properties of the exposed areas are selectively altered to enable development of an image. In a preferred embodiment, the radiation is UV or visible light.

The photopolymer may be produced, for example, by co-polymerizing suitable monomers containing the desired repeating units along with a polymerizable group. The polymerizable group may, for example, be polymerized by step-growth polymerization using appropriate functional groups or by a chain polymerization such as radical polymerization. Some non-limiting examples of useful radical polymerizable groups include acrylates (e.g. acrylate, methacrylate, cyanoacrylate and the like), acrylamides, vinylenes (e.g., styrenes), vinyl ethers and vinyl acetates. Alternatively, the photopolymer may be produced by functionalizing preformed polymers to attach desired repeating units.

In an embodiment, the solubility-altering reactive group is an acid-forming precursor group that is acid-catalyzed (chemically amplified). Upon exposure to light, the acid-forming precursor group generates a polymer-bound acid group, e.g., a carboxylic or sulfonic acid. This can drastically change its solubility relative to the unexposed regions thereby allowing development of an image with the appropriate solvent. In an embodiment, the developing solution comprises a hydrofluoroether developing solvent that selectively dissolves unexposed areas.

A chemically amplified acid-forming precursor group typically requires addition of a photo-acid generator (PAG) to the photopolymer composition, e.g., as a small molecule additive to the solution. The PAG may function by directly absorbing radiation (e.g. UV light) to cause decomposition of the PAG and release an acid. Alternatively, a sensitizing dye may be added to the composition whereby the sensitizing dye absorbs radiation and forms an excited state capable of reacting with a PAG to generate an acid. The sensitizing dye may be added as a small molecule, or alternatively, may be attached to, or otherwise incorporated as part of, the photopolymer as another repeating unit, as discussed below. In an embodiment, the sensitizing dye (either small molecule or attached) is fluorinated. In an embodiment, the sensitizing dye may be provided in a range of 0.5 to 10% by weight relative to the total copolymer weight. The photochemically generated acid catalyzes the de-protection of acid-labile protecting groups of the acid-forming precursor. In certain cases, such de-protection may occur at room temperature, but commonly, an exposed chemically amplified photopolymer is heated for a short time ("post exposure bake") to more fully activate de-protection "switching". In some embodiments, chemically amplified photopolymers can be desirable since they enable the exposing step to be performed through the application of relatively low energy UV light exposure (e.g., less than 500 mJ/cm$^2$ or in some embodiments under 100 mJ/cm$^2$). This is advantageous since some active organic materials useful in applications to which the present disclosure pertains may decompose in the presence of too much UV light, and therefore, reduction of the energy during this step permits the photopolymer to be exposed without causing significant photolytic damage to underlying active organic layers. Also, reduced light exposure times improve the manufacturing throughput of the desired devices.

Examples of acid-forming precursor groups that yield a carboxylic acid include, but are not limited to: A) esters capable of forming, or rearranging to, a tertiary cation, e.g., t-butyl ester, t-amyl ester, 2-methyl-2-adamantyl ester, 1-ethylcyclopentyl ester, and 1-ethylcyclohexyl ester; B) esters of lactone, e.g., γ-butyrolactone-3-yl, γ-butyrolactone-2-yl, mavalonic lactone, 3-methyl-γ-butyrolactone-3-yl, 3-tetrahydrofuranyl, and 3-oxocyclohexyl; C) acetal esters, e.g., 2-tetrahydropyranyl, 2-tetrahydrofuranyl, and 2,3-propylenecarbonate-1-yl; D) beta-cyclic ketone esters, E) alpha-cyclic ether esters and F) MEEMA (methoxy ethoxy ethyl methacrylate) and other esters which are easily hydrolyzable because of anchimeric assistance. In an embodiment, a polymerizable monomer comprises an acrylate-based polymerizable group and a tertiary alkyl ester acid-forming precursor group, e.g., t-butyl methacrylate ("TBMA") or 1-ethylcyclopentyl methacrylate ("ECPMA").

In an embodiment, the total fluorine content of the photopolymer is in a range of 0% to 15% by weight and the acid-forming precursor group includes a non-cyclic, tertiary alkyl ester moiety, wherein the non-cyclic, tertiary alkyl comprises 10 or fewer carbon atoms, or alternatively, 6 or fewer carbon atoms. In an embodiment, the acid-forming precursor group includes a cyclic alkyl ester moiety and the photopolymer has a fluorine content of at least 10% but less than 30% by weight.

In an embodiment, the solubility-altering reactive group is an hydroxyl-forming precursor group (also referred to herein as an "alcohol-forming precursor group"). The hydroxyl-forming precursor includes an acid-labile protecting group and the photopolymer composition typically includes a PAG compound and operates as a "chemically amplified" type of system. Upon exposure to light, the PAG generates an acid (either directly or via a sensitizing dye as described above), which in turn, catalyzes the de-protection of the hydroxyl-forming precursor group, thereby forming a polymer-bound alcohol (hydroxyl group). This significantly changes its solubility relative to the unexposed regions thereby allowing development of an image with the appropriate fluorinated solvent. In an embodiment, the developing solution includes a fluorinated solvent that selectively dissolves unexposed areas.

In an embodiment, the hydroxyl-forming precursor has a structure according to formula (1):

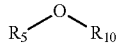

(1)

wherein $R_5$ is a carbon atom that forms part of the first repeating unit (or first polymerizable monomer), and $R_{10}$ is an acid-labile protecting group. Non-limiting examples of useful acid-labile protecting groups include those of formula (AL-1), acetal groups of the formula (AL-2), tertiary alkyl groups of the formula (AL-3) and silane groups of the formula (AL-4).

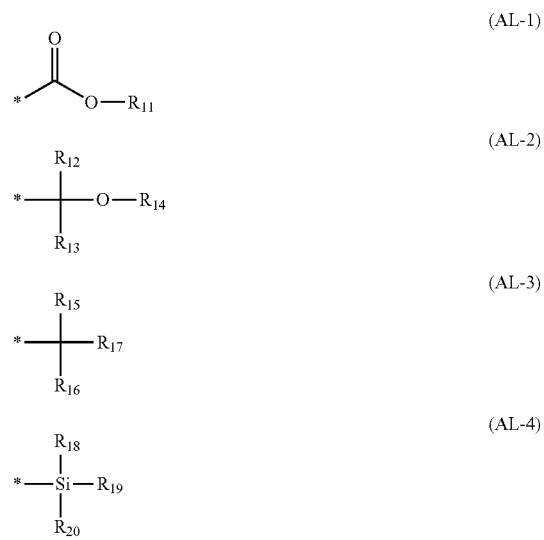

In formula (AL-1), $R_{11}$ is a monovalent hydrocarbon group, typically a straight, branched or cyclic alkyl group, of 1 to 20 carbon atoms that may optionally be substituted with groups that a skilled worker would readily contemplate would not adversely affect the performance of the precursor. In an embodiment, $R_{11}$ may be a tertiary alkyl group. Some representative examples of formula (AL-1) include:

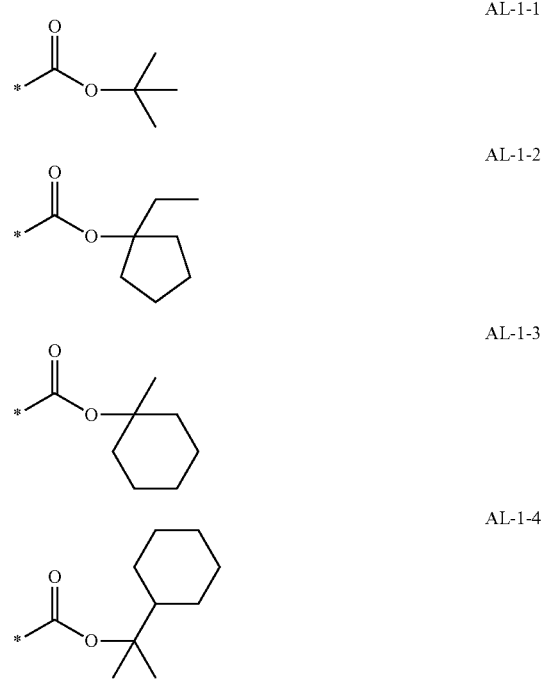

-continued

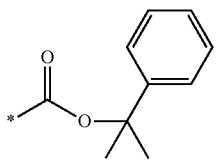
AL-1-5

In formula (AL-2), $R_{14}$ is a monovalent hydrocarbon group, typically a straight, branched or cyclic alkyl group, of 1 to 20 carbon atoms that may optionally be substituted. $R_{12}$ and $R_{13}$ are independently selected hydrogen or a monovalent hydrocarbon group, typically a straight, branched or cyclic alkyl group, of 1 to 20 carbon atoms that may optionally be substituted. Some representative examples of formula (AL-2) include:

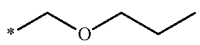
AL-2-1

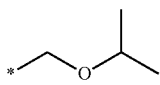
AL-2-2

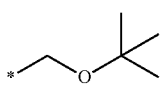
AL-2-3

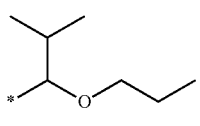
AL-2-4

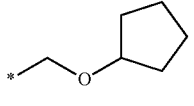
AL-2-5

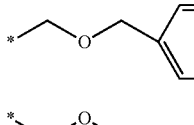
AL-2-6

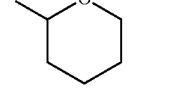
AL-2-7

In formula (AL-3), $R_{15}$, $R_{16}$, and $R_{17}$ represent an independently selected a monovalent hydrocarbon group, typically a straight, branched or cyclic alkyl group, of 1 to 20 carbon atoms that may optionally be substituted. Some representative examples of formula (AL-3) include:

AL-3-1

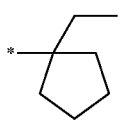
AL-3-2

AL-3-3

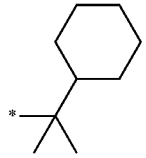
AL-3-4

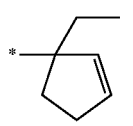
AL-3-5

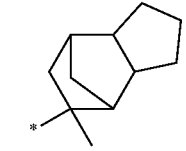
AL-3-6

In formula (AL-4), $R_{18}$, $R_{19}$ and $R_{20}$ are independently selected hydrocarbon groups, typically a straight, branched or cyclic alkyl group, of 1 to 20 carbon atoms that may optionally be substituted.

The descriptions of the above acid-labile protecting groups for formulae (AL-2), (AL-3) and (AL-4) have been described in the context of hydroxyl-forming precursors. These same acid-labile protecting groups, when attached instead to a carboxylate group, may also be used to make some of the acid-forming precursor groups described earlier.

In an embodiment, a photopolymer comprising a solubility-altering reactive group having a non-aromatic cyclic substituent has at least 10%, by weight of fluorine, and further includes one or more branching units. In an embodiment, a photopolymer comprising a solubility-altering reactive group having a non-aromatic oxygen-containing heterocyclic substituent has at least 5%, preferably at least 10% by weight of fluorine, and further includes one or more branching units.

The PAG should have some solubility in the coating solvent and developer. The amount of PAG required depends upon the particular system, but generally, will be in a range of about 0.1 to 6% by weight relative to the photopolymer. In an embodiment, the presence of a sensitizing dye may substantially reduce the amount of PAG required relative to a composition that does not include a sensitizing dye. In an embodiment, the amount of PAG is in a range of 0.1 to 3% relative to the photopolymer. PAGS that are fluorinated or non-ionic or both are particularly useful. Some useful examples of PAG compounds include 2-[2,2,3,3,4,4,5,5-octafluoro-1-(nonafluorobutylsulfonyloxyimino)-pentyl]-fluorene (ONPF) and 2-[2,2,3,3,4,4,4-heptafluoro-1-(nonafluorobutylsulfonyloxyimino)-butyl]-fluorene (HNBF). Other non-ionic PAGS include: norbornene-based non-ionic PAGs such as N-hydroxy-5-norbornene-2,3-dicarboximide perfluorooctanesulfonate, N-hydroxy-5-norbornene-2,3-dicarboximide perfluorobutanesulfonate, and N-hydroxy-5-norbornene-2,3-dicarboximide trifluoromethanesulfonate; and naphthalene-based non-ionic PAGs such as N-hydroxynaphthalimide perfluorooctanesulfonate, N-hydroxynaphthalimide perfluorobutanesulfonate and N-hydroxynaphthalimide trifluoromethanesulfonate.

Some additional classes of PAGs include: triarylsulfonium perfluoroalkanesulfonates, such as triphenylsulfonium perfluorooctanesulfonate, triphenylsulfonium perfluorobutanesulfonate and triphenylsulfonium trifluoromethanesulfonate; triarylsulfonium hexafluorophosphates (or hexafluoroantimonates), such as triphenylsulfonium hexafluorophosphate and triphenylsulfonium hexafluoroantimonate; triaryliodonium perfluoroalkanesulfonates, such as diphenyliodonium perfluorooctanesulfonate, diphenyliodonium perfluorobutanesulfonate, diphenyliodonium trifluoromethanesulfonate, di-(4-tert-butyl)phenyliodonium, perfluorooctanesulfonate, di-(4-tert-butyl)phenyliodonium perfluorobutanesulfonate, and di-(4-tert-butyl)phenyliodonium trifluoromethanesulfonate; and triaryliodonium hexafluorophosphates (or hexafluoroantimonates) such as diphenyliodonium hexafluorophosphate, diphenyliodonium hexafluoroantimonate, di-(4-tert-butyl)phenyliodonium hexafluorophosphate, and di-(4-tert-butyl)phenyliodonium hexafluoroantimonate. Suitable PAGs are not limited to those specifically mentioned above. Combinations of two or more PAGs may be used as well.

In an embodiment, the photopolymer further comprises (in addition to the first repeating unit) a repeating unit having a fluorine-containing group. The fluorine containing group is preferably a fluorine-containing alkyl or aryl group that may optionally be further substituted with chemical moieties other than fluorine, e.g., chlorine, a cyano group, or a substituted or unsubstituted alkyl, alkoxy, alkylthio, aryl, aryloxy, amino, alkanoate, benzoate, alkyl ester, aryl ester, alkanone, sulfonamide or monovalent heterocyclic group, or any other substituent that a skilled worker would readily contemplate that would not adversely affect the performance of the photopolymer. In a preferred embodiment, the fluorine-containing group is an alkyl group having at least 5 fluorine atoms, or alternatively, at least 10 fluorine atoms. In an embodiment, the alkyl group is a hydrofluorocarbon or hydrofluoroether having at least as many fluorine atoms as carbon atoms. In an embodiment, the fluorine-containing group is perfluorinated alkyl or a 1H,1H,2H,2H-perfluorinated alkyl having at least 4 carbon atoms, for example, 1H,1H,2H,2H-perfluorooctyl (i.e., 2-perfluorohexyl ethyl). Throughout this disclosure, unless otherwise specified, any use of the term alkyl includes straight-chain, branched and cyclo alkyls. In an embodiment, the repeating unit having a fluorine-containing group does not contain protic or charged substituents, such as hydroxy, carboxylic acid, sulfonic acid, quaternized amine or the like. A non-limiting example of a polymerizable monomer having a fluorine containing group is 1H,1H,2H,2H-perfluorooctyl methacrylate ("FOMA").

In an embodiment, the photopolymer further comprises (in addition to the first repeating unit) a repeating unit having a sensitizing dye. The presence of a sensitizing dye can reduce the amount of radiation exposure required for imaging the photopolymer. In an embodiment using a repeating unit having as sensitizing dye, the photopolymer has at least 1%, preferably at least 5% fluorine by weight. A fluorinated polymer can help solubilize an attached sensitizing dye in a fluorinated solvent, thereby enabling the use of a sensitizing dye that might otherwise have poor solubility.

In an embodiment, a repeating unit having a sensitizing dye has no fluorine atoms and is provided in a weight range of 1 to 10% relative to the copolymer, alternatively in a weight range of 1 to 6% relative to the copolymer, or in another embodiment, in a weight range of 1 to 4% relative to the copolymer.

In an embodiment, a repeating unit having a sensitizing dye is also partially fluorinated. The fluorine atoms can be included as part of a polymerizable group or as part of the sensitizing dye. Fluorine can be attached to an alkyl, aryl or heteroaryl moiety. In an embodiment, a repeating unit comprising a sensitizing dye and which is partially fluorinated is provided in a weight range of 1 to 20% relative to the photopolymer, alternatively in a weight range of 2 to 15% relative to the copolymer.

Some non-limiting examples of useful sensitizing dye classes include cyanine dyes, rhodamine compounds, dialkylaminobenezes, diaryl ketones (e.g., benzophenones), arylalkyl ketones (e.g., acetophenones), chromanones, xanthones, thioxanthones, benzothiazoles, benzoxazoles, benzimidazoles, pyrimidines, quinolines, coumarins, psoralens, pyrromethenes, naphthalenes, anthracenes, tetracenes, pyrelenes, and pyrenes.

In an embodiment, the photopolymer further comprises (in addition to the first repeating unit) a repeating unit having "dry-etch-resistant" group. It is common in photolithography to etch patterns into layers using a "dry etchant" with the patterned photopolymer acting as an etch barrier. Herein, the term "dry etchant" is used broadly and refers to any useful gaseous material possessing energy sufficient to etch (remove) a target material. Dry etching includes, but is not limited to, glow discharge methods (e.g., sputter etching and reactive ion etching), ion beam etching (e.g., ion milling, reactive ion beam etching, ion beam assisted chemical etching) and other "beam" methods (e.g., ECR etching and downstream etching), all of which are methods known in the art. Some common dry etchants include oxygen plasma, argon plasma, UV/ozone, $CF_4$ and $SF_6$, and various combinations.

It can be advantageous, therefore, for the photopolymer to have reasonable resistance to the dry etch to ensure good pattern transfer to the underlying layer. The photopolymer may optionally comprise a repeating unit having a dry-etch-resistant group, e.g., a cyclic alkyl such as adamantyl or isobornyl, or a group that includes at least one dry-etch-resistant atom having an atomic weight of at least 24. In an embodiment, the dry-etch-resistant atom is Si, Ti, Ge, Al, Zr, or Sn. The dry-etch-resistant group may optionally be formed from a polymerizable monomer, e.g., one that has a cyclic alkyl, an organosilane, a siloxane, silazane or metalloxane group. In a preferred embodiment, the dry-etch-resistant group includes a silane or siloxane group.

In an embodiment, the photopolymer may further comprise (in addition to the first repeating unit) a branching unit to form a branched polymer. The term "branched polymer" refers to a polymer chain having at least one branching unit that forms one or more branch points connecting three or more chain segments. In some embodiments, branched photopolymers have improved solubility. It has been found that branching makes available more variations in repeating units that may otherwise have impractically low solubility in fluorinated solvents when provided as straight-chain type polymers. A branched copolymer of the present disclosure may be a brush/comb type, a star type, a hyperbranched type, dendrimer type or any other known in the art. The branched copolymer may simply have three chain segments or many more. A generic structure is shown below as branched polymer (A):

(A)

wherein Ch1 is a first chain segment, Ch2 is a second chain segment, Ch3 is a third chain segment and BU is a branching unit. In an embodiment, the branching unit may be conveniently defined as a single atom capable of bonding to at least three polymer chain segments, e.g., a carbon, nitrogen, silicon or aluminum atom. In an embodiment, the branching unit may be conveniently defined as chemical compound, typically a compound having multiple polymerizable groups or other functional groups capable of forming branch points.

In an embodiment, the branching unit is provided by a branching monomer having at least two polymerizable sites capable of being copolymerized with other monomers, such as a monomer comprising a solubility-altering reactive group. Some representative examples of branching monomers include: aliphatic or alicyclic divinyl hydrocarbons such as isoprene, butadiene, 3-methyl-1,2-butadiene, 2,3-dimethyl-1,3-butadiene, 1,2-polybutadiene, pentadiene, hexadiene, octadiene, cyclopentadiene, cyclohexadiene, cyclooctadiene, norbornadiene, and the like; aromatic divinyl hydrocarbons such as divinylbenzene, divinyltoluene, divinylxylene, trivinylbenzene, divinylbiphenyl, divinylnaphthalene, divinylfluorene, divinylcarbazole, divinylpyridine, and the like; diivinyl and diallyl esters such as divinyl adipate, divinyl maleate, divinyl phthalate, divinyl isophthalate, divinyl itaconate, vinyl(meth)acrylate, diallyl maleate, diallyl phthalate, diallyl isophthalate, diallyl adipate, allyl(meth)acrylate, and the like; divinyl and diallyl ethers such as diallyl ether, diallyloxyethane, triallyloxyethane, tetraallyloxyethane, tetraallyloxypropane, tetraallyloxybutane, tetramethallyloxyethan; divinyl ether, diethylene glycol divinyl ether, triethylene glycol divinyl ether, and the like; divinyl ketones; diallyl ketones; fluorine-containing divinyl compounds such as 1,4-divinylperfluorobutane, 1,6-divinylperfluorohexane, 1,8-divinylperfluorooctane, and the like; nitrogen-containing divinyl compounds such as diallylamine, diallylisocyanurate, diallylcyanurate, methylenebis(meth)acrylamide, bismaleimide, and the like; silicon-containing divinyl compound such as dimethyldivinylsilane, divinylmethylphenylsilane, diphenyldivinylsilane, 1,3-divinyl-1,1,3,3-tetramethyldisilazane, 1,3-divinyl-1,1,3,3-tetraphenyldisilazane, diethoxyvinylsilane, and the like.

In a preferred embodiment, the branching monomer having at least two polymerizable sites are based on (meth)acrylic acid esters such as ethylene glycol di(meth)acrylate (EGD(M)A), triethylene glycol di(meth)acrylate, propylene glycol di(meth)acrylate, neopentyl glycol di(meth)acrylate, trimethylolpropane tri(meth)acrylate, ditrimethylolpropane tetra(meth)acrylate, glycerol tri(meth)acrylate, pentaerythritol tetra(meth)acrylate, alkoxytitanium tri(meth)acrylate, 1,6-hexanediol di(meth)acrylate, 2-methyl-1,8-octanediol di(meth)acrylate, 1,9-nonanediol di(meth)acrylate, 1,10-decanediol di(meth)acrylate, tricyclodecanedimethanol di(meth)acrylate, dioxane glycol di(meth)acrylate, 2-hydroxy-1-acryloyloxy-3-methacryloyloxypropane, 2-hydroxy-1,3-di(meth)acryloyloxypropane, 9,9-bis[4-(2-(meth) acryloyloxyethoxy)phenyl]fluorene, undecylenoxy ethyleneglycol di(meth)acrylate, bis[4-(meth)acryloylthiophenyl]sulfide, bis[2-(meth)acryloylthioethyl]sulfide, 1,3-adamantanediol di(meth)acrylate, 1,3-adamantanedimethanol di(meth)acrylate, and the like.

A combination of multiple branching monomers or branching units having different chemical structures may be used. In an embodiment, the mole % of branching units relative to the total of all copolymer units is in a range of 1-10%, or alternatively, in a range of 2-6%. Methods for preparing branched polymers by radical polymerization can be found, for example, in U.S. Pat. No. 6,646,068 and US Publication No. 2012/0135206, the contents of which are incorporated by reference. In an embodiment, chain transfer agents are used in conjunction with a radical polymerization initiator to control branching.

Non-limiting examples of useful chain transfer agents include thiols such as alkyl mercaptans (e.g., dodecyl mercaptan), alkylk thioglycolates (e.g., 2-ethyl hexyl thioglycolate), polyfunctional thiols, and brominated compounds such as carbon tetrabromide. In the polymerization reaction, a thiol type chain transfer agent may terminate polymerization of a chain segment by addition of a thiol radical to form a sulfur-containing terminal group, e.g., a thioether. In the case of carbon tetrabromide, a chain segment-terminating bromine or a bromine-containing group may be formed. In an embodiment, chain transfer agent is provided into the reaction vessel in a mol ratio relative to the branching monomer in a range of 0.05 to 10, or in another embodiment in a range of 0.1 to 5, or in another embodiment 0.5 to 2.

In an embodiment, the photopolymer may further include (in addition to the first repeating unit) a repeating unit comprising an alkyl or aromatic group that is neither fluorinated nor an acid-catalyzed, solubility-altering reactive group. It may be used to adjust various properties of the photopolymer such as its solubility, reactivity, coatability, Tg or other property.

The photopolymer may include various combinations of repeating units described above.

A photopolymer composition of the present disclosure may be applied to a substrate (sometimes referred to herein as an organic device substrate) using any method suitable for depositing a photosensitive liquid material. For example, the composition may be applied by spin coating, curtain coating, bead coating, bar coating, spray coating, dip coating, gravure coating, ink jet, flexography or the like. The composition may be applied to form a uniform film or a patterned layer of unexposed photopolymer. Alternatively, the photopolymer can be applied to the substrate by transferring a preformed photopolymer layer (optionally patterned) from a carrier sheet, for example, by lamination transfer using heat, pressure or both. In such an embodiment, the substrate or the preformed photopolymer layer may optionally have coated thereon an adhesion promoting layer.

The contrast of the present photopolymer system can be an important performance factor. Higher contrast is typically preferred, as it generally results in straighter sidewalls for imaged areas and overall better discrimination between imaging light and stray light for improved feature resolution.

To study contrast, the following method was generally used which can be modified as needed by one skilled in the art. A subject photopolymer was spin coated onto a silicon wafer and soft-baked on a hot plate for 1 min at 90° C. The film thickness was generally in a range of about 1 to 1.5 µm. An optical 22-step tablet (~0.15 density units per step) was laid on top of the wafer and the resist was exposed to 365 nm radiation using a 16 W filtered black light lamp. The maximum exposure dose was typically about 175 mJ/cm$^2$. The wafer was post-exposure baked (PEB) on a hot plate for 1 min at 90° C. to activate the switching reaction. The film thickness was then immediately measured in 24 areas (steps). In addition to the 22 areas of the step tablet, the maximum exposure dose was measured just outside of the step tablet area (point 1) as well as a minimum exposure dose area (covered by a metal disc) that received no exposure (point 24).

Five minutes after the PEB, the wafer was contacted with ~10 mL of a developer solution by forming a "puddle" over the wafer and spin-dried after the target time was reached. The time of each puddle and number of puddles depended on the system. After each puddle, the film thicknesses were measured in the same 24 areas. Film thicknesses after each puddle were normalized to the starting thickness and plotted versus log Exposure (log(E)) to create a set of contrast curves. The contrast between each point was calculated using equation 1:

$$\text{Contrast} = [\Delta \text{normalized thickness}]/[\Delta \log(E)] \quad (\text{Eq. 1})$$

The highest calculated contrast (the "maximum contrast") for each curve was determined. FIG. 1 shows an example graph of normalized thickness vs. log(E)—for clarity, only the first 16 points are shown. Other parameters can also be determined as desired such as "0.5 speed point" (exposure dose at normalized film thickness=0.5), "Emax erosion" (normalized thickness loss of the maximum exposure point 1), "time to clear" (time it takes for the minimum exposure to be fully removed), and "time to strip" (time it takes for maximum exposure to be fully removed). In an embodiment, the photopolymer has a contrast of at least 1.5, preferably at least 1.9.

In an embodiment, the present invention can be used to form organic devices having a layer of sensitive, active organic material (see above). Such devices may include electronic devices such as TFTs, touch screens, OLED lighting and displays, e-readers, LCD displays, solar cells, sensors and bioelectronics devices. These devices are often multilayer structures having numerous other layers such as dielectric layers, optical layers, conductors and a support. Devices may include non-electronic devices such as optical, medical, and biological devices having some patterned active organic material, but that do not require an electrical conductor or semiconductor to operate (e.g., lenses, color filter arrays, down- or up-conversion filters, medical/biological test strips and the like). The organic device substrate onto which the photopolymer is provided may include a single layer of a support material or may include a multilayer structure having a support and numerous additional layers. The substrate surface is not necessarily planar. The substrate and support are optionally flexible. Support materials include, but are not limited to, plastics, metals, glasses, ceramics, composites and fabrics.

Figure 2:
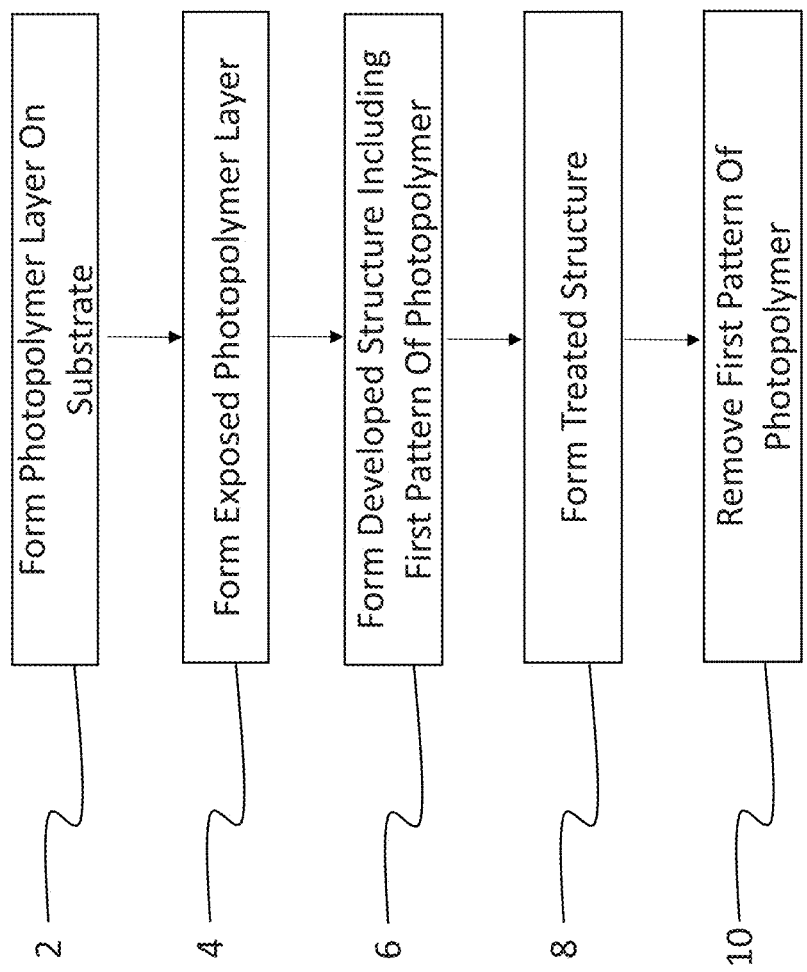
FIG. 2 is a flow chart depicting the steps in an embodiment of the present invention.

A flow diagram for an embodiment of the present invention is shown in FIG. 2, and includes the step 2 of forming a photopolymer layer on a substrate. This can be accomplished using methods previously described.

In step 4, the photopolymer layer is exposed to patterned radiation, e.g. UV light, to form an exposed photopolymer layer having a pattern of exposed photopolymer and a complementary pattern of unexposed photopolymer. The term "radiation" refers to any radiation to which the photopolymer is sensitive and can form areas of differential developability due to some chemical or physical change caused by the radiation exposure. Non-limiting examples of radiation include UV, visible and IR light, e-beams and X-rays. Commonly, the radiation is from UV or visible light. Patterned radiation can be produced by many methods, for example, by directing exposing light through a photomask and onto the photopolymer layer. Photomasks are widely used in photolithography and often include a patterned layer of chrome that blocks light. The photomask may be in direct contact or in proximity. When using a proximity exposure, it is preferred that the light has a high degree of collimation. Alternatively, the patterned light can be produced by a projection exposure device. In addition, the patterned light can be from a laser source that is selectively directed to certain portions of the photopolymer layer. After exposure and optional post exposure bake, at least some of the solubility-altering reactive groups (e.g. acid- or alcohol-forming precursor groups) in the exposed pattern have reacted to form a reacted group (e.g. an acid or alcohol group).

In step 6, a developed structure is formed that includes a first pattern of photopolymer. This can be done by contacting the exposed photopolymer layer to a developing solution comprising a hydrofluoroether developing solvent. During development, the complementary pattern of unexposed photopolymer is removed (negative working photopolymer). Development leaves behind a developed structure having a first pattern of photopolymer that covers the substrate and a complementary second pattern of uncovered substrate corresponding to the removed portion of photopolymer. By uncovered substrate, it is meant that the surface of the substrate is substantially exposed or revealed to a degree that it can be subjected to further treatments—a small amount of residual photopolymer may be present in some embodiments. Contacting the exposed photopolymer layer can be accomplished by immersion into the developing solution or by applying the developing solution in some way, e.g., by spin coating or spray coating. The contacting can be performed multiple times if necessary.

In step 8, a treated structure is formed by treating the developed structure in some way. In an embodiment, the treating includes a chemical or physical etch of the second pattern of uncovered substrate. In this case, the first pattern of photopolymer acts as an etch barrier. In another embodiment, the treating includes chemically modifying the surface of the second pattern of uncovered substrate or the first pattern of photopolymer. In another embodiment, the treating includes doping, oxidizing, or reducing the second pattern of uncovered substrate, e.g., to modify its conductivity. In yet another embodiment, the treating includes coating the developed structure with, for example, an active organic material that is deposited both on the surface of the first pattern of photopolymer and on the second pattern of uncovered substrate. In any of the above embodiments, the substrate may optionally include an active organic material layer such that the uncovered substrate is the surface of that active organic material layer.

In step 10, the first pattern of photopolymer is optionally removed from the treated structure using a stripping solution. In embodiments wherein the surface of the first pattern of photopolymer is covered with another layer of material, e.g., an active organic material layer, that portion is also removed. This is sometimes referred to as a "lift off" process.

Turning now to FIG. 3, there is a series of cross-sectional views depicting the formation of a patterned active organic material structure at various stages according to an embodiment of the present invention. In FIG. 3A, a substrate 20 includes a layer of active organic material 24 provided on a support 22. In FIG. 3B, a photopolymer layer 26 is formed on the substrate 20 and in contact with the layer of active organic material 24. Next, as shown in FIG. 3C, photopolymer layer 26 is exposed to patterned light by providing a photomask 30 between the photopolymer layer 26 and a source of collimated light 28. The exposed photopolymer layer 32 includes a pattern of exposed photopolymer areas 34 and complementary pattern of unexposed photopolymer areas 36. The structure is then developed in a developing solution comprising a hydrofluoroether developing solvent. As illustrated in FIG. 3D the unexposed areas 36 of the photopolymer are selectively dissolved to form a developed structure 38 having a first pattern of photopolymer 40 covering the substrate, and a complementary second pattern of uncovered substrate 42, in this case the layer of active organic material 24, corresponding to the removed portion of photopolymer. Turning now to FIG. 3E, a treated structure 44 is formed by subjecting the developed structure 38 to a chemical or physical etch that selectively removes active organic material from the second pattern of uncovered substrate, thereby forming a patterned layer of active organic material 46 corresponding to the first pattern. By corresponding, it is meant that the patterned layer of active organic material 46 substantially resembles that of the first pattern of photopolymer 40, but the two patterns are not necessarily identical. For example, the etching might also etch the sidewalls of the patterned layer of active organic material, thereby making the dimensions slightly smaller than the first pattern. Conversely, etching kinetics or diffusion might be such that the dimensions of the patterned layer of active organic material are slightly larger than the first pattern. Further, the patterned layer of active organic material might not have vertical sidewalls as shown. Rather than rectangular, its cross section could resemble a trapezoid, an inverted trapezoid (undercut), or some other shape, e.g., one having curved sidewalls. Referring to FIG. 3F, treated structure 44 is contacted with a stripping solution that removes the first pattern of photopolymer 40, thereby forming patterned active organic material structure 48 having the (now bare) patterned layer of active organic material 46. Patterned active organic material structure 48 may optionally be subjected to additional steps, if necessary, to form a functional device such as an organic TFT array, an OLED display, an e-reader, a solar cell, a touch screen, a bioelectronic device, a medical device or the like.

In a related embodiment to that shown in FIG. 3, the active organic material 24 is a conductive polymer and the developed structure 38 is treated with a chemical oxidant to form a treated structure. In this embodiment, the conductive polymer is not removed, but rather, its conductivity has been substantially reduced or deactivated in a pattern corresponding to the second. Examples of suitable chemical oxidants are disclosed, e.g., in US 2013/0295354.

Figure 4C:
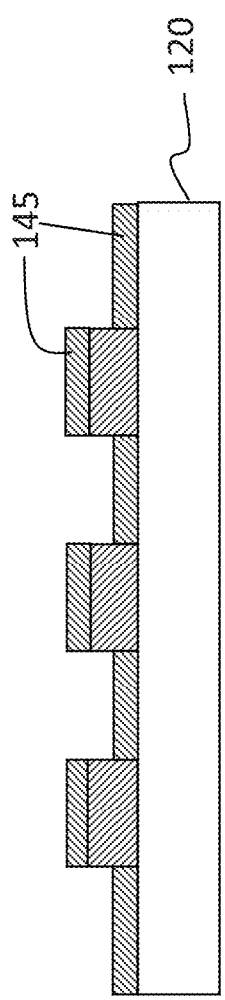
Figure 4D:
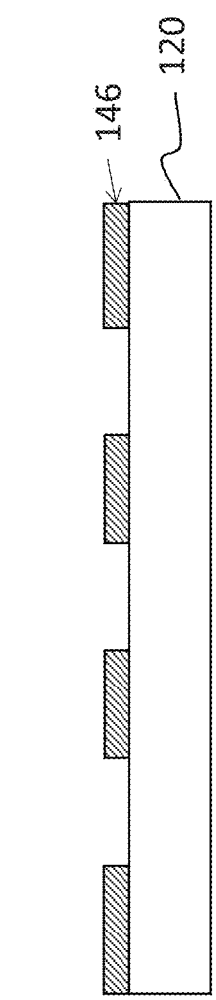

FIG. 4 shows a series of cross-sectional views depicting the formation of a patterned active organic material structure at various stages according to another embodiment of the present invention. In FIG. 4A, a photopolymer layer 126 is formed on substrate 120. This structure is then exposed and developed as described above to form developed structure 138, as shown in FIG. 4B. Developed structure 138 has a first pattern of photopolymer 140 covering the substrate, and a complementary second pattern of uncovered substrate 142 corresponding to a removed portion of photopolymer. Turning now to FIG. 4C, a treated structure 144 is formed by depositing a layer of active organic material 145 over both the first pattern of photopolymer and the second pattern of uncovered substrate. In FIG. 4D, the treated structure 144 is then contacted with a stripping solution that removes the first pattern of photopolymer and the active organic material deposited over the first pattern of photopolymer, thereby forming patterned active organic material structure 148 having a patterned layer of active organic material 146 corresponding to the second pattern. By corresponding, it is meant that the patterned layer of active organic material 146 substantially resembles that of the second pattern of uncovered substrate 142, but the two patterns are not necessarily identical. Patterned active organic material structure 148 may optionally be subjected to additional steps, if necessary, to form a functional device such as an organic TFT array, an OLED display, an e-reader, a solar cell, a bioelectronic device or the like.

EXAMPLES

In the examples below, most of the HFE solvents were purchased from 3M under their Novec™ brand. For convenience, the solvents are simply referred to by their HFE number. HFE-6512 was purchased from Top Fluorochem Co, LTD.

Synthesis Example 1

Poly-TBMA

To a 250 mL jacketed four-necked flask equipped with a teflon-blade stirrer, a reflux condenser with a mineral oil bubbler outlet, sub-surface nitrogen sparge tube, and a thermometer was charged 28.4 g (~32.5 mL, 0.2 mol.) tert-butyl methacrylate (TBMA), 87.2 g (~56.5 mL) HFE-7600 and 0.723 g (4.38 mmol.) AIBN [2.5 wt % initiator level]. The agitator motor was programmed for 200 rpm stirring. The sparge tube was adjusted so it is below the surface of the solution and nitrogen was bubbled subsurface for 1 hour. During the sparge, the constant temperature bath (CTB) connected to the jacket of the reaction flask was preheated to 76° C. with flow to the flask turned off. When the nitrogen sparge was complete the nitrogen flow was reduced so that a slight positive flow was maintained throughout the reaction. The valves to the CTB were opened to the reaction flask. The reaction was stirred for 20 hours at 200 rpm with 76° C. fluid circulating through the flask jacket. The reaction mixture was cooled to ambient temperature and diluted to 6.8 wt % by the addition of 302 g of HFE-7600. The poly-TBMA has substantially no fluorine content, but was surprisingly soluble in this hydrofluoroether solvent.

A 42 g sample of this solution was removed and the solvent was removed in vacuo to provide a solid sample of dry polymer suitable for analytical testing. Size Exclusion Chromatography showed Mn=16200, Mw=58700, Mw/Mn=3.624, and the Tg was determined to be 110.6° C. A PAG compound can be added to the desired amount to make the photosensitive composition. In this particular example, 0.254 g of CGI 1907 ("ONPF" aka Ciba 1907) from BASF was added as the PAG to the remaining solution.

Various polymers and copolymers using different monomers can be prepared by one skilled in the art by appropriate modification of the method described above. HFE-6512 is another useful solvent for preparation and of these polymers.

Example 1

A composition comprising 8% by weight solution of poly-TBMA in HFE-7600 from Synthesis Example 1 (0% fluorine by weight) was spin coated onto a Si wafer at 1000 rpm to form a photopolymer layer approximately 1.5 μm thick. The film was post apply baked on a hot plate at 90° C. for 60 seconds to remove excess solvent. The bake temperature or time can be adjusted to control the free volume of the polymer film to control such aspects as PAG diffusion or airborne amine penetration that can cause "amine poisoning" of the surface, causing less acid reaction near the surface compared with the bulk of the film. Temperature may also be lowered to work with a particularly temperature sensitive active organic material that may be underneath the photopolymer layer or with a temperature sensitive support, such as PET. An oven bake may also be used instead of the hot plate bake.

The photopolymer layer was exposed to UV radiation, activating the photo-acid through light absorption by the PAG. In the present embodiment, Ciba 1907 PAG from BASF was used, being sensitive at i-line (365 nm) and shorter wavelengths, but another PAG with different wavelength sensitivities could be substituted, as long as the PAG is soluble in HFE-7600 casting solvent. The UV light was filtered through a photomask in order to expose the resist in particular places to form patterns of exposed and unexposed regions in the photopolymer layer. Typical exposure doses ranged from 20-880 mJ/cm2 at 365 nm.

The resist was then subjected to a post exposure bake (PEB) on a hot plate at 90° C. for 60 seconds to cause the photo-generated acid to react with, and de-protect, the TBMA units, turning them into methacrylic acid (MAA) units on the same chain. A longer bake time or higher bake temperature will result in more de-protection, comparable to a higher UV exposure dose.

Figure 5:
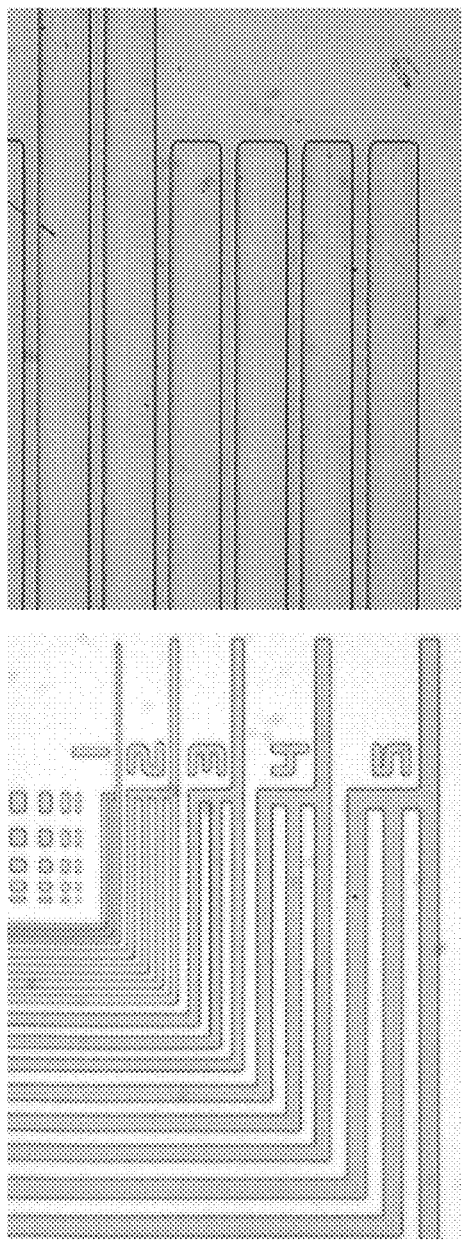
FIG. 5 shows photographic images of poly-TBMA photopolymer patterns after UV exposure and development on a Si substrate (left) and on a PEDOT:PSS-coated PET substrate (right).

The resist film was then developed with HFE-7600 in the present embodiment, although another hydrofluoroether solvent that solvates the resist film can be used instead (e.g., HFE-6512). The developer removes the unexposed areas that have not been deprotected, resulting in a negative tone pattern on the substrate. The areas that have been deprotected, or partially deprotected, become less soluble to the developer and remain. FIG. 5 shows the results of this exposure and development process on a poly-TBMA resist with Ciba 1907 PAG from BASF. The image on the left shows features down to 1 μm lines/spaces formed on a silicon substrate using an i-line ASML stepper exposure tool. The image on the right shows 60 μm lines and 25 μm spaces, and was obtained using a contact aligner exposure tool with the poly-TBMA provided on top of a flexible PET substrate coated with the conducting polymer PEDOT:PSS. Following development, the imaged poly-TBMA structures can optionally be stripped by contact with a stripping solution comprising a protic solvent such as IPA.

Example 2

Dissolution Rate Measurements

A series of photopolymer solutions were prepared using HFE-7600 as coating solvent, CGI 1907 as PAG (2.0% by wt relative to polymer wt), and photopolymers prepared by copolymerizing TBMA with various amounts of FOMA, the mol ratios for which are shown in Table 1. The dissolution rate for unexposed polymers coated on Si wafers were measured by interferometry using a Filmetrics F20 Thin-Film Analyzer using either HFE-7600 or HFE-6512 as the hydrofluoroether developing solvent. The dissolution was usually directly proportional to contact time indicating that mass transport was not rate-limiting.

TABLE 1

| | TBMA/FOMA | | Dissolution rate (nm/sec) | |
|---|---|---|---|---|
| type | mol ratio (%) | % F by weight | HFE-6512 | HFE-7600 |
| Comp | 50/50 | 42.8 | >1000 | 770 |
| Inv | 93/7 | 10.6 | 50 | 18 |
| Inv | 95/5 | 7.9 | 39 | 13 |
| Inv | 97/3 | 4.9 | 35 | 12 |
| Inv | 99/1 | 1.7 | 52 | 19 |
| Inv | 100/0 | 0 | 46 | 15 |

The solubility of copolymers of TBMA at low FOMA levels was surprising. One can see a downward trend in dissolution rates as FOMA level gets lower, but the dissolution rates are perfectly acceptable for practical development times. Even more unexpected was the observation that at 0 and 1 mol % FOMA, the solubility trend partially reversed, being higher than 3 and 5% FOMA. Although poly-TBMA (0 mol % FOMA) provides the largest raw material cost advantage relative to 50% FOMA copolymers, the 1% FOMA provides a useful increase in development rate and is still significantly less expensive than 50% FOMA.

Example 3

Contrast curves (see above for procedure) were measured for the 0, 1 and 7 mol % FOMA polymers from Example 2 using HFE-7600 or HFE-6512 as the hydrofluoroether developing solvent. The photopolymer layer were each about 1.0 μm thick. Various parameters were determined as reported in Table 2. In this example, the maximum exposure dose was about 175 mJ/cm$^2$.

TABLE 2

| TBMA/FOMA mol ratio (%) | Developing solvent | Max Contrast (@ dev time, sec) | Stripping solvent (+5% vol. IPA) | Est. time to strip Emax (sec) |
|---|---|---|---|---|
| 100/0 | 7600 | 3.6 (150) | 7600 | 100 |
| 100/0 | 6512 | 4.9 (60) 3.9 (90) | 6512 | 180 |
| 99/1 | 7600 | 1.7 (90) 3.5 (150) | 7600 | 110 |
| 99/1 | 6512 | 3.4 (30) 3.8 (45) | 6512 | 45 |
| 93/7 | 7600 | 3.0 (90) 3.5 (150) | 7600 | 110 |
| 93/7 | 6512 | 3.7 (60) 3.0 (90) | 6512 | 85 |

Table 2 shows that good contrasts were achieved in both developing solvents, but slightly higher contrasts were observed in HFE-6512 and they were obtained at shorter development times, consistent with dissolution rate data from Table 1. The maximum exposure step (Emax) of all samples stripped in an adequate time period with only 5% by volume of IPA added to the HFE solvent. Typically, higher IPA (protic solvent) will result in faster stripping. A small amount of FOMA (even just 1 mole %) in the polymer significantly reduces time to strip in HFE-6512/IPA stripping solution.

Example 4

ECPMA (1-ethylcyclopentyl methacrylate) is a polymerizable monomer having an acid-forming precursor group, specifically, a cyclic tertiary alkyl ester. Attempts to synthesize a pure poly-ECPMA polymer in HFE-7600 at high concentration were unsuccessful (significant precipitation was observed). Although there may be some solubility of poly-ECPMA in HFE-7600, in some embodiments, it is preferred to coat from a hydrofluoroether solvent and solubility issues may limit film thickness. Nevertheless, it was surprisingly found that adding a low level fluorination to the polymer, preferably with some amount of branching, can provide a very useful photopolymer that may be prepared in HFE-7600. For example, a branched polymer was prepared in HFE-7600 comprising a copolymer of FOMA, ECPMA, and EGDMA (ethylene glycol dimethylacrylate) in mole ratios of 20, 76 and 4, respectively. The photopolymer had 21.2% by weight of fluorine relative to the polymer weight. CGI 1907 was added to the solution at 2% by weight relative to the polymer. The dissolution rate of a layer of this photopolymer in HFE-7600 was determined to be 210 nm/sec. A contrast curve was measured as described above using HFE-7600 as the developer except the maximum exposure=325 mJ/cm$^2$, and the post exposure bake was 3 min at 90° C. The photopolymer had a maximum contrast of 3.3 at just 30 s of development.

There was thickness non-uniformity in some of the steps, but it was clearly suitable for use in many photolithographic applications. The maximum exposure step (Emax) stripped completely in less than 15 seconds using HFE-7600 having 20% by volume IPA.

Example 5

THPOEMA (2-[(2-tetrahydropyranyl)oxy]ethyl methacrylate) is a polymerizable monomer having an alcohol-forming precursor group. Like Example 4, attempts to synthesize a pure poly-THPOEMA polymer in HFE-7600 at high concentration were unsuccessful (significant precipitation was observed). Although there may be some solubility of poly-THPOEMA in HFE-7600, in some embodiments, it is preferred to coat from a hydrofluoroether solvent and solubility issues may limit film thickness. Nevertheless, it was surprisingly found that adding a low level of fluorination to the polymer, preferably with some amount of branching, can provide a very useful photopolymer that may be prepared in HFE-7600. For example, a branched polymer was prepared in HFE-7600 comprising a copolymer of FOMA, THPOEMA, and EGDMA in mole ratios of 10, 86 and 4, respectively. The photopolymer had 10.5% by weight of fluorine relative to the polymer weight. CGI 1907 was added to the solution at 2% by weight relative to the polymer. The dissolution rate of a layer of this photopolymer in HFE-7600 was determined to be at least 210 nm/sec. A second branched THPOEMA polymer was prepared comprising a copolymer of FOMA, THPOEMA, and EGDMA in mole ratios of 20, 76 and 4, respectively. The photopolymer had 19.2% by weight of fluorine relative to the polymer weight. CGI 1907 was added to the solution at 2% by weight relative to the polymer. The dissolution rate of a layer of this photopolymer in HFE-7600 was determined to be about 560 nm/sec (very fast). There was significant thickness non-uniformity for these particular polymers for reasons unknown, which made obtaining reliable contrast curves difficult due to uncertainties in obtaining film thickness measurements. Still, the films appear to have high contrast and are believed to be suitable for use in many photolithographic applications. The maximum exposure step (325 mJ/cm$^2$ with post exposure bake of 3 min at 90° C.) stripped completely in less than 15 seconds using HFE-7600 having 20% by volume IPA for the first THPOEMA polymer. The second THPOEMA polymer stripped in less than 5 sec.

Example 6

A photopolymer was prepared comprising a copolymer of FOMA, TBMA and AMMA (9-anthrylmethyl methacrylate, a sensitizing dye) in mole ratios of 23/75/2 respectively. The photopolymer had 26.8% fluorine by weight relative to the photopolymer. CGI 1907 was added to the solution at 2% by weight relative to the polymer. The dissolution rate of a layer of this photopolymer in HFE-7600 was determined to be about 100 nm/sec. A contrast curve was measured as described above using HFE-7600 as the developer (maximum exposure=175 mJ/cm$^2$, and the post exposure bake was 1 min at 90° C.). The photopolymer had a maximum contrast of 2.9 at 30 s of development and 3.6 at 60 s of development. Relative to the samples from Example 2, this photopolymer was more sensitive by about an order of magnitude. The "0.5 speed points" at 30 s and 60 s development times were 1.5 and 2.0 mJ/cm$^2$, respectively. By way of example, the 93/7 TBMA/FOMA "0.5 speed point" was about 36 mJ/cm$^2$ at its 90 s development time in HFE-7600. In some embodiments, high photosensitivity is desired in order to reduce overall exposure of the device to radiation. The maximum exposure step (Emax) stripped completely in about 30 seconds using HFE-7600 having 20% by volume IPA. It is noted that the maximum exposure was far higher than needed given the speed point. Thus, it is likely that a more appropriate exposure could be stripped in even less time or that lower IPA could be used.

Example 7

A branched photopolymer was prepared comprising a copolymer of FOMA, TBMA, AMMA and EGDMA in mole ratios of 23/75/2/3 respectively. The photopolymer had 26.6% fluorine by weight relative to the photopolymer. CGI 1907 was added to the solution at 2% by weight relative to the polymer. The dissolution rate of a layer of this photopolymer in HFE-7600 was determined to be about 280 nm/sec. A contrast curve was measured as described above using HFE-7600 as the developer (maximum exposure=175 mJ/cm$^2$, and the post exposure bake was 1 min at 90° C.). In HFE-7600, however, both exposed and unexposed features are removed. That is, HFE-7600 is an effective stripping agent without any protic solvent added with Emax stripped in about 100 sec.

A second contrast curve was measured using HFE-7200 as the developing agent. The dissolution rate of a layer of this photopolymer in HFE-7200 was determined to be about 42 nm/sec. The photopolymer had a maximum contrast of 1.6 at 30 s of development and 2.2 at 60 s of development. There was a small amount of dissolution of the Emax even in HFE-7200 developing solution, but even at 60 s of development, >85% of the Emax thickness was retained. Since no protic solvents are required (HFE-7600 can be used as sole stripping solvent), this photopolymer is suitable for use with a broad range of active organic materials. The reduced FOMA (fluorine %) makes this photopolymer more cost effective than some prior art orthogonal photoresist systems.

Example 8

PEDOT Stability with Various Treatments

The robustness of a conductive polymer (PEDOT:PSS, Aldrich, 3-4% in water, high-conductivity grade) to various materials and methods of the present disclosure was tested as follows. A 1×1 inch glass substrate was provided with three parallel stripes of silver separated by about 6 mm. A film of PEDOT:PSS was applied by spin coating at 1000 rpm and then dried at 90° C. for 25 min. The resistance of the PEDOT:PSS film was measured by contacting probes of an ohmmeter to the first and second silver lines before and after various treatments. One can mask off a portion of the silver lines prior to PEDOT coating or simply push the probes through the PEDOT to make contact with the silver lines. Resistance measurements using the probes contacted to PEDOT directly (without silver contacts) were unreliable and typically very high due to high contact resistance. Results are shown in Table 3.

TABLE 3

| Treatment | Resistance (ohms) |
| --- | --- |
| None (start) | 26 |
| 1 min HFE-7600 puddle, spin dry | 26 |
| 1 min HFE-6512 puddle, spin dry | 26 |
| 1 min HFE-7200 puddle, spin dry | 26 |
| 1 min IPA puddle, spin dry | 26 |

TABLE 3-continued

| Treatment | Resistance (ohms) |
|---|---|
| Coat poly-TBMA (0% F) from Ex. 2; bake 1.5 min at 90° C. (no light exposure); develop with 2-45 sec puddles HFE-7600 | 26 |
| Coat poly-TBMA (0% F) from Ex. 2; bake 1.5 min at 90° C.; expose 365 nm UV 260 mJ/cm$^2$, bake 1.5 min at 90° C.; strip 2-45 sec puddles HFE-7600 w/20% vol IPA | 26 |

It is readily apparent that the materials and methods described above are fully compatible with PEDOT:PSS conductive polymer and no degradation in conductivity was observed. A photolithographic patterning method using conventional photoresists have been disclosed in the prior art. However, standard developing and stripping agents are disclosed as having a negative impact on the PEDOT conductivity. See AGFA publication "Orgacon™ Conductive Transparent Films Application Sheet—Patterning Orgacon™ film by means of UV lithography" revised May 2001. Thus, the prior art system is less robust and requires tighter process control.

Example 9

PEDOT Patterning

A PEDOT sample was prepared as described in Example 8. The resistance of the PEDOT between the first and second silver stripes was found to be 40Ω, and similarly, the resistance of the PEDOT between the second and third silver stripes was found also to be 40Ω. Poly-TBMA (0% F, 2% CGI 1907 PAG) was spin coated from HFE-7600 coating solvent to provide ~1 μm film and baked on a hot plate at 90° C. for 1 min. The film was exposed to 365 nm UV light to provide a total dose of ~260 mJ/cm$^2$, then baked on a hot plate for 90° C. for 1 min. During the exposure, light was masked in a 2 mm wide strip between, and parallel to, the first and second silver stripes. The film was developed in HFE-7600 for 150 sec thereby removing unexposed photopolymer in the 2 mm wide strip. The developed structure was treated by immersion for 5 min in a 5% by weight aqueous solution of sodium diisocyanurate to deactivate conductivity of the PEDOT layer in the 2 mm wide developed area. The treated structure was washed in tap water and then DI water for 1 min. The photopolymer was then stripped by contact with IPA for 60 sec. The resistance of the PEDOT between the first and second silver stripes was now too high to measure (no conductivity), whereas the resistance between the second and third silver stripes was found to be 39Ω. Thus, the photopolymer acted as an effective photolithographic barrier to the sodium diisocyanurate and the processing solvents had no detrimental impact on the PEDOT conductivity.

Prior disclosures regarding orthogonal photoresists direct the skilled worker to use photopolymers having a fluorine content of at least 30% by weight. As described above, it has been found that photopolymers having lower levels of fluorine, or even no fluorine, can be surprisingly effective. In certain embodiments, the low fluorine systems of the present disclosure can result in lower cost photopolymers, lower cost photoprocessing chemistry, improved recyclability (reduced cost and environmental impact), or combinations thereof, while maintaining orthogonal behavior with respect to sensitive active organic materials, and providing good film contrast in acceptable processing cycle times.

The invention has been described in detail with particular reference to certain preferred embodiments thereof, but it will be understood that variations, combinations, and modifications can be effected by a person of ordinary skill in the art within the spirit and scope of the invention.

LIST OF REFERENCE NUMBERS USED IN THE DRAWINGS 2 form photopolymer layer on substrate step
4 form exposed photopolymer layer step
6 form developed structure step
8 form treated structure step
10 remove first pattern of photopolymer step
20 substrate
22 support
24 layer of active organic material
26 photopolymer layer
28 light
30 photomask
32 exposed photopolymer layer
34 exposed photopolymer areas
36 unexposed photopolymer areas
38 developed structure
40 first pattern of photopolymer
42 second pattern of uncovered substrate
44 treated structure
46 patterned layer of active organic material
48 patterned active organic material structure
120 substrate
126 photopolymer layer
138 developed structure
140 first pattern of photopolymer
142 second pattern of uncovered substrate
144 treated structure
145 layer of active organic material
146 patterned layer of active organic material
148 patterned active organic material structure

The invention claimed is:

1. A method of patterning an organic device using a photopolymer, comprising:
   forming a photopolymer layer on an organic device substrate, the photopolymer layer including a photopolymer comprising at least a first repeating unit having an acid-catalyzed, solubility-altering reactive group, wherein the total fluorine content of the photopolymer is less than 30% by weight;
   exposing the photopolymer layer to patterned radiation to form an exposed photopolymer layer; and
   contacting the exposed photopolymer layer with a developing agent to remove unexposed photopolymer, thereby forming a developed structure having a first pattern of exposed photopolymer covering the substrate and a complementary second pattern of uncovered substrate corresponding to the unexposed photopolymer, the developing agent comprising at least 50% by volume of a hydrofluoroether developing solvent.

2. The method of claim 1 further comprising:
   treating the developed structure to form a treated structure; and
   contacting the treated structure with a stripping agent to remove the first pattern of exposed photopolymer.

3. The method of claim 2 wherein the stripping agent comprises a hydrofluoroether stripping solvent or a protic solvent or both.

4. The method of claim 3 wherein the stripping agent comprises at least 0.5% by volume of the protic solvent.

5. The method of claim 4 wherein the stripping agent comprises at least 50% by volume of the hydrofluoroether stripping solvent.

6. The method of claim 5 wherein the hydrofluoroether stripping solvent is the same as the hydrofluoroether developing solvent.

7. The method of claim 3 wherein the protic solvent is an alcohol.

8. The method of claim 1 wherein the total fluorine content of the photopolymer is in a range of 0% to 15% by weight.

9. The method of claim 8 wherein the total fluorine content of the photopolymer is in a range of 1% to 15% by weight.

10. The method of claim 8 wherein the solubility-altering reactive group is an acid-forming precursor group and includes a non-cyclic tertiary alkyl ester moiety, the non-cyclic tertiary alkyl comprising ten or fewer carbon atoms.

11. The method of claim 10 wherein the non-cyclic tertiary alkyl is t-butyl.

12. The method of claim 1 wherein the photopolymer further includes a second repeating unit having a fluorine-containing group.

13. The method of claim 12 wherein the photopolymer further includes one or more branching units.

14. The method of claim 12 wherein the solubility-altering reactive group is an acid-forming precursor group or an alcohol-forming precursor group.

15. The method of claim 1 wherein the photopolymer layer further comprises a non-ionic photo-acid generator compound.

16. The method of claim 1 wherein the hydrofluoroether developing solvent is selected from the group consisting of an isomeric mixture of methyl nonafluorobutyl ether and methyl nonafluoroisobutyl ether, an isomeric mixture of ethyl nonafluorobutyl ether and ethyl nonafluoroisobutyl ether, 3-ethoxy-1,1,1,2,3,4,4,5,5,6,6,6-dodecafluoro-2-trifluoromethyl-hexane, 1,1,1,2,3,3-hexafluoro-4-(1,1,2,3,3,3,-hexafluoropropoxy)-pentane, 1-methoxyheptafluoropropane, 1,1,1,2,2,3,4,5,5,5-decafluoro-3-methoxy-4-trifluoromethylpentane, 1,3-(1,1,2,2-tetrafluoroethoxy)benzene, 1,2-(1,1,2,2-tetrafluoroethoxy)ethane, 1,1,2,2-tetrafluoroethyl-1H,1H,5H-octafluoropentyl ether, 1,1,2,2-tetrafluoroethyl-2,2,2-trifluoroethyl ether, 1,1,2,2-tetrafluoroethyl-2,2,3,3-tetrafluoropropyl ether, and 1,1,1,2,2,3,3,4,4,5,5,6,6-tridecafluorooctane-propyl ether.

17. The method of claim 1 wherein the layer of photopolymer is provided by coating a composition comprising the photopolymer and a hydrofluoroether coating solvent.

18. The method of claim 1 wherein the total fluorine content of the photopolymer is less than 1% by weight.

* * * * *